(12) United States Patent
Furuya et al.

(10) Patent No.: US 8,748,293 B2
(45) Date of Patent: Jun. 10, 2014

(54) ORGANOPOLYSILOXANE, TEMPORARY ADHESIVE COMPOSITION CONTAINING ORGANOPOLYSILOXANE, AND METHOD OF PRODUCING THINNED WAFER USING THE SAME

(75) Inventors: Masahiro Furuya, Annaka (JP); Hiroyuki Yasuda, Annaka (JP); Shohei Tagami, Annaka (JP); Michihiro Sugo, Annaka (JP); Hideto Kato, Annako (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 167 days.

(21) Appl. No.: 13/406,114

(22) Filed: Feb. 27, 2012

(65) Prior Publication Data

US 2012/0276717 A1 Nov. 1, 2012

(30) Foreign Application Priority Data

Apr. 26, 2011 (JP) ................................. 2011-98324

(51) Int. Cl.
*H01L 21/461* (2006.01)
*H01L 21/463* (2006.01)
*C08G 77/20* (2006.01)

(52) U.S. Cl.
USPC ......... 438/459; 528/32; 528/40; 257/E21.211

(58) Field of Classification Search
CPC ..... H01L 21/461; H01L 21/463; C08G 77/20
See application file for complete search history.

(56) References Cited

U.S. PATENT DOCUMENTS

| 6,623,399 | B2 * | 9/2003 | Fey et al. .......................... 476/7 |
| 7,541,264 | B2 | 6/2009 | Gardner et al. |
| 2005/0233547 | A1 | 10/2005 | Noda et al. |
| 2008/0207848 | A1 * | 8/2008 | Morita et al. .................. 525/475 |
| 2011/0309407 | A1 * | 12/2011 | Hamamoto et al. .......... 257/100 |
| 2012/0184663 | A1 * | 7/2012 | Hamamoto et al. .......... 524/500 |

FOREIGN PATENT DOCUMENTS

| JP | A-2004-064040 | 2/2004 |
| JP | A-2006-328104 | 12/2006 |
| WO | WO 2006/038638 A1 | 4/2006 |

OTHER PUBLICATIONS

Aug. 14, 2012 Extended European Search Report issued in European Application No. EP12002822.0.
Extended European Search Report issued in European Patent Application No. 13001828.6 dated May 27, 2013.

* cited by examiner

*Primary Examiner* — Robert S Loewe
(74) *Attorney, Agent, or Firm* — Oliff PLC

(57) ABSTRACT

The present invention provides a non-aromatic saturated hydrocarbon group-containing organopolysiloxane containing the following units (I) to (III):

(I) a siloxane unit (T unit) represented by $R^1SiO_{3/2}$: 40 to 99 mol %;

(II) a siloxane unit (D unit) represented by $R^2R^3SiO_{2/2}$: 59 mol % or less; and (III) a siloxane unit (M unit) represented by $R^4R^5R^6SiO_{1/2}$: 1 to 30 mol %.

There can be an organopolysiloxane, which is soluble in a nonpolar organic solvent so that the organopolysiloxane can be peeled in a short time, and which is hardly soluble in a polar organic solvent to be exemplarily used upon coating a photoresist onto a semiconductor side of a joined substrate and removing the photoresist therefrom so that the organopolysiloxane is not peeled from the supporting substrate upon coating a photoresist onto a semiconductor side of a joined substrate and removing the photoresist therefrom.

15 Claims, No Drawings

ORGANOPOLYSILOXANE, TEMPORARY ADHESIVE COMPOSITION CONTAINING ORGANOPOLYSILOXANE, AND METHOD OF PRODUCING THINNED WAFER USING THE SAME

BACKGROUND OF THE INVENTION

1. Field of the Invention

The present invention relates to an organopolysiloxane, a temporary adhesive composition containing the organopolysiloxane, and a method of producing a thinned wafer using the same.

2. Description of the Related Art

Three-dimensional semiconductor packaging has become indispensable, so as to realize more increased densities and more increased capacities. The three-dimensional semiconductor packaging technique is a semiconductor fabricating technique configured to thin a single semiconductor chip, and to stack such chips in a multi-layered manner while wire-connecting them with one another by through silicon vias (TSV). Required for realizing such a technique are a step for thinning a substrate formed with a semiconductor circuit by back-surface grinding, and an electrode forming step for forming electrodes and the like including TSV on the back surface. Conventionally, in the back-surface grinding step of a silicon substrate before the electrode forming step, it has been typical to apply a protective tape onto a surface of the silicon substrate opposite to the surface to be ground, thereby avoiding wafer damages upon grinding. However, such a tape adopts an organic resin film as a base material thereof, so that the film is unsuitable for conducting a wiring layer forming process at a back surface of the silicon substrate because the tape is flexible but is insufficient in strength, heat resistance.

As such, there has been proposed a system configured to join a semiconductor substrate via adhesive to a supporting substrate made of silicon, glass, or the like, in a manner to be sufficiently durable against a back-surface grinding step and a back-surface electrode forming step. To be important at this time is an adhesive upon joining both substrates to each other. This adhesive is required to possess an adhesiveness of joining the substrates to each other without gaps therebetween, and a sufficient durability to be durable against subsequent processes, as well as such an ability to finally allow the thinned wafer to be easily peeled from the supporting substrate. In this way, this adhesive will be called as a "temporary adhesive", because the same is to be peeled finally.

As known temporary adhesives and peeling methods therefor, there have been proposed up to now: a technique configured to irradiate a light of high intensity to an adhesive containing a light-absorbing substance so as to decompose an adhesive layer to thereby peel the adhesive layer from a supporting substrate (Japanese Patent Application Laid-Open Publication No. 2004-64040); and a technique configured to adopt, as an adhesive, a heat-meltable hydrocarbon-based compound, in a manner to conduct joining and peeling in the heated and melted state thereof (Japanese Patent Application Laid-Open Publication No. 2006-328104). The former has been problematic, due to necessity of an expensive apparatus such as laser and the like, and due to an extended processing time per one substrate. Further, although the latter is convenient since controlling is conducted by heating only, thermal stability is insufficient at high temperatures exceeding 200° C., thereby resulting in narrowed applications of processes.

SUMMARY OF THE INVENTION

Further, there has been proposed a technique adopting a silicone glue as a temporary adhesive layer, so as to realize a three-dimensional semiconductor packaging technique (U.S. Pat. No. 7,541,264). This is to adopt the silicone glue of an addition curable type to thereby join substrates to each other, and to immerse both substrates upon peeling into such a chemical solution adapted to dissolve or decompose a silicone resin. As such, this requires an extremely extended time for peeling, so that application of this technique to an actual production process is difficult.

In turn, since the aforementioned temporary adhesives are brought to be unnecessary after peeling and they are thus required to be cleaned and removed by organic solvents, the adhesives have to be easily dissolved in cleaning organic solvents. However, the adhesives are contrary required to be hardly soluble in those organic solvents to be exemplarily used upon coating a photoresist onto a semiconductor side of a joined substrate and removing the photoresist therefrom. It is an extremely important characteristic in this usage, to control a solubility of a temporary adhesive in such organic solvents.

A organopolysiloxane mainly having such organic groups, i.e., a methyl group and a phenyl group to be used for a conventional organopolysiloxane, exhibit higher solubility in polar organic solvents such as acetone, propylene glycol monoethyl ether acetate (PGMEA), N-methylpyrrolidone, and the like, so that such temporary adhesives are required to be improved for the above usage.

The present invention has been carried out to solve the above problem, and it is therefore an object of the present invention to provide an organopolysiloxane, which is excellent in adhesiveness and heat resistance, which is soluble in a nonpolar organic solvent, and which is in turn hardly soluble in a polar organic solvent to be exemplarily used upon coating a photoresist onto a semiconductor side of a joined substrate and removing the photoresist therefrom. It is another object of the present invention to provide a temporary adhesive composition containing the organopolysiloxane of the present invention, which can be peeled from a supporting substrate in a short time, and which is not peeled from the supporting substrate upon coating a photoresist onto a semiconductor side of a joined substrate and removing the photoresist therefrom. It is a further object of the present invention to provide a method of producing a thinned wafer by adopting the temporary adhesive composition.

To solve the above problem, the present invention provides a non-aromatic saturated hydrocarbon group-containing organopolysiloxane containing the following units (I) to (III):

(I) a siloxane unit (T unit) represented by $R^1SiO_{3/2}$: 40 to 99 mol %;

(II) a siloxane unit (D unit) represented by $R^2R^3SiO_{2/2}$: 59 mol % or less; and (III) a siloxane unit (M unit) represented by $R^4R^5R^6SiO_{1/2}$: 1 to 30 mol %;

wherein each $R^1$ to $R^6$ represents a monovalent organic group or a hydrogen atom;

40 mol % or more of all the organic groups and hydrogen atoms represented by the $R^1$ to $R^6$ are each a non-aromatic saturated hydrocarbon group having 3 to 20 carbon atoms;

30 mol % or more of all the organic groups and hydrogen atoms represented by the $R^1$ to $R^3$ may be the same or different and represent non-aromatic saturated hydrocarbon groups, having one of the following cyclic structures having 5 to 7 carbon atoms:

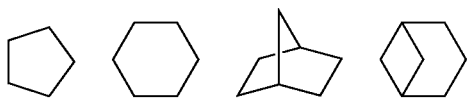

and, those, other than non-aromatic saturated hydrocarbon groups of all the organic groups and hydrogen atoms represented by the $R^1$ to $R^6$, may be the same or different and represent hydrogen atoms or substituted or unsubstituted monovalent hydrocarbon groups, having 1 to 7 carbon atoms.

In this way, the organopolysiloxane is made to have, as its organic groups, the non-aromatic saturated hydrocarbon groups, respectively, so that the organopolysiloxane is excellent in adhesiveness and heat resistance, is soluble in a nonpolar organic solvent, and is in turn hardly soluble in a polar organic solvent to be exemplarily used upon coating a photoresist onto a semiconductor side of a joined substrate and removing the photoresist therefrom. Namely, 40 mol % or more of all the organic groups and hydrogen atoms represented by the $R^1$ to $R^6$ of the T, D, and M units are each made to be a non-aromatic saturated hydrocarbon group having 3 to 20 carbon atoms; 30 mol % or more of all the organic groups and hydrogen atoms represented by the $R^1$ to $R^3$ may be made to be the same or different and represent non-aromatic saturated hydrocarbon groups, having one of the cyclic structures having 5 to 7 carbon atoms; and, those, other than non-aromatic saturated hydrocarbon groups of all the organic groups and hydrogen atoms represented by the $R^1$ to $R^6$, may be made to be the same or different and represent hydrogen atoms or substituted or unsubstituted monovalent hydrocarbon groups, having 1 to 7 carbon atoms; so that the organopolysiloxane is made to be hardly soluble in a polar organic solvent to be exemplarily used upon coating a photoresist onto a semiconductor side of a joined substrate and removing the photoresist therefrom, and is in turn made to be soluble in a nonpolar hydrocarbon solvent such as hexane, octane, isododecane, or the like to be used upon peeling.

Further, the present invention preferably provides an organopolysiloxane obtained by subjecting an alkenyl group-containing organopolysiloxane (A1) to a hydrosilylation reaction with a hydrosilyl group-containing compound (A2) in the presence of a platinum group metal-based catalyst;

wherein the alkenyl group-containing organopolysiloxane (A1) is the aforementioned non-aromatic saturated hydrocarbon group-containing organopolysiloxane, which 2 to 30 mol % of all the organic groups and hydrogen atoms represented by the $R^1$ to $R^6$ are each an alkenyl group having 2 to 7 carbon atoms;

wherein the hydrosilyl group-containing compound (A2) is represented by the following average composition formula (1):

$$R^7_a R^8_b H_c SiO_{(4-a-b-c)/2} \quad (1),$$

wherein $R^7$ represents a monovalent organic group other than an alkenyl group; $R^8$ represents a divalent organic group; and a, b, and c represent positive numbers satisfying that: $0 \le a \le 2.5$, $0 \le b \le 1$, $0.75 \le a+b \le 2.5$, $0.005 \le c \le 1$, and $0.8 \le a+b+c \le 4$, wherein the hydrosilyl group-containing compound (A2) contains at least two SiH groups in one molecule, and wherein the hydrosilyl group-containing compound (A2) is such content that the total molar amount of the SiH groups is 0.4 to 1.0 times a total molar amount of the alkenyl groups contained in the alkenyl group-containing organopolysiloxane (A1).

The organopolysiloxane made to have a higher molecular weight in this way, is made to be soluble in a nonpolar organic solvent, is in turn made to be hardly soluble in a polar organic solvent to be exemplarily used upon coating a photoresist onto a semiconductor side of a joined substrate and removing the photoresist therefrom, and is further made to be excellent in adhesiveness and heat resistance.

Furthermore, the present invention preferably provides an organopolysiloxane obtained by subjecting a hydrosilyl group-containing organopolysiloxane (A3) to a hydrosilylation reaction with an alkenyl group-containing compound (A4) in the presence of a platinum group metal-based catalyst;

wherein the hydrosilyl group-containing organopolysiloxane (A3) is the aforementioned non-aromatic saturated hydrocarbon group-containing organopolysiloxane, which 2 to 20 mol % of all the organic groups and hydrogen atoms represented by the $R^1$ to $R^6$ are each a hydrogen atom;

wherein the alkenyl group-containing compound (A4) is represented by the following average composition formula (2)

$$R^9_d R^{10}_e R^{11}_f SiO_{(4-d-e-f)/2} \quad (2),$$

wherein $R^9$ represents a monovalent organic group other than an alkenyl group; $R^{10}$ represents a divalent organic group; $R^{11}$ represents an alkenyl group having 2 to 6 carbon atoms; d, e, and f represent positive numbers satisfying that: $0 \le d \le 2$, $0 \le e \le 1$, $0.75 \le d+e \le 3$, $0.01 \le f \le 1$, and $0.8 \le d+e+f \le 4$, wherein the alkenyl group-containing compound (A4) contains at least two alkenyl groups in one molecule, and wherein the alkenyl group-containing compound (A4) is such content that the total molar amount of the alkenyl groups is 1.0 to 2.5 times a total molar amount of the SiH groups contained in the hydrosilyl group-containing organopolysiloxane (A3).

The organopolysiloxane made to have a higher molecular weight in this way, is made to be soluble in a nonpolar organic solvent, is in turn made to be hardly soluble in a polar organic solvent to be exemplarily used upon coating a photoresist onto a semiconductor side of a joined substrate and removing the photoresist therefrom, and is further made to be excellent in adhesiveness and heat resistance.

It is preferable that the hydrosilyl group-containing compound (A2) is an organohydrogenpolysiloxane having SiH groups at both ends, as represented by the following structural formula (3), or a bis-silyl compound having SiH groups at both ends, as represented by the following structural formula (4):

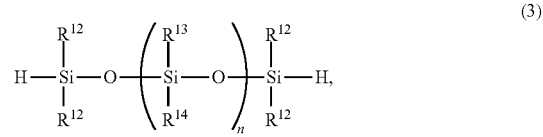

wherein n represents a positive number of 0 to 400; and $R^{12}$ to $R^{14}$ may be the same or different and represent substituted or unsubstituted monovalent organic groups,

(4)

wherein $R^{15}$ to $R^{17}$ may be the same or different and represent substituted or unsubstituted monovalent organic groups, and X represents a divalent organic group.

Such a hydrosilyl group-containing compound (A2) is preferable from standpoints that the hydrosilyl group-containing compound (A2) is apt to be easily promoted in hydrosilylation reaction with alkenyl groups of the alkenyl group-containing organopolysiloxane (A1), and that the hydrosilyl group-containing compound (A2) is made to be excellent in compatibility with the alkenyl group-containing organopolysiloxane (A1).

Further, the present invention provides a temporary adhesive composition containing: (A) the aforementioned organopolysiloxane; and (B) an organic solvent.

If such a temporary adhesive composition is adapted, the temporary adhesive composition, which is excellent in adhesiveness and heat resistance, which is soluble in a nonpolar organic solvent so that the temporary adhesive can be peeled from a supporting substrate in a short time, and which is hardly soluble in a polar organic solvent to be exemplarily used upon coating a photoresist onto a semiconductor side of a joined substrate and removing the photoresist therefrom so that the temporary adhesive is not peeled from the supporting substrate upon coating a photoresist onto a semiconductor side of a joined substrate and removing the photoresist therefrom, can be provided.

Further, it is preferable that the organic solvent (B) is a hydrocarbon solvent having a boiling point of 120 to 240° C.

When the hydrocarbon solvent has the boiling point of 120 to 240° C., the temporary adhesive composition is made to be spin coated and is excellent in safety. The boiling point of 120° C. or higher is preferable in that the hydrocarbon solvent is then made to have a higher flash point, and the boiling point of 240° C. or lower is preferable in that the hydrocarbon solvent is easily volatilized by heating and drying after coating of the hydrocarbon solvent and rarely remains in the coating in a manner to restrict formation of air bubbles at the joining interface even when the temporary adhesive composition is exposed to a high temperature in a heating process after joining of the substrates.

Moreover, the present invention provides a method of producing a thinned wafer by joining a wafer having a circuit-formed surface and a circuit-unformed surface to a supporting substrate, and by grinding the wafer, comprising:

a joining step for forming, on the circuit-formed surface and/or on the supporting substrate, an adhesive layer by the aforementioned temporary adhesive composition, and joining the wafer and the supporting substrate to each other through the adhesive layer therebetween;

a grinding step for grinding the circuit-unformed surface of the wafer joined to the supporting substrate;

a peeling step for peeling the wafer after grinding, from the supporting substrate at the adhesive layer; and a removing step for removing the adhesive layer remaining on the circuit-formed surface of the peeled wafer.

Such a method of producing a thinned wafer enables to peel the wafer from a supporting substrate in a short time in the peeling step, and enables to produce the thinned wafer with a higher efficiency because the wafer is not peeled from the supporting substrate in the production process of the thinned wafer even when a photoresist is coated onto a semiconductor side of a joined substrate and removed therefrom, for example.

According to the organopolysiloxane of the present invention, the temporary adhesive composition containing the organopolysiloxane, and the method of producing a thinned wafer using the temporary adhesive composition as explained above, it is allowed to provide an organopolysiloxane and a temporary adhesive composition containing such an organopolysiloxane, which organopolysiloxane is excellent in adhesiveness and heat resistance, is soluble in a nonpolar organic solvent, and is in turn hardly soluble in a polar organic solvent to be exemplarily used upon coating a photoresist onto a semiconductor side of a joined substrate and removing the photoresist therefrom, thereby enabling production of a thinned wafer with a higher efficiency.

DETAILED DESCRIPTION OF THE PREFERRED EMBODIMENTS

Although the organopolysiloxane of the present invention, the temporary adhesive composition containing such an organopolysiloxane, and the method of producing a thinned wafer using the same will be described hereinafter in detail, the present invention is not limited thereto.

As described above, it has been desired to develop a temporary adhesive, which is soluble in a nonpolar organic solvent so that the temporary adhesive can be peeled in a short time, and which is hardly soluble in a polar organic solvent to be exemplarily used upon coating a photoresist onto a semiconductor side of a joined substrate and removing the photoresist therefrom so that the temporary adhesive is not peeled from the supporting substrate upon coating a photoresist onto a semiconductor side of a joined substrate and removing the photoresist therefrom.

As a result of repeatedly conducting keen examination to achieve the problem, the present inventors have found out that an organopolysiloxane is made to be hardly soluble in a polar organic solvent to be exemplarily used upon coating a photoresist onto a semiconductor side of a joined substrate and removing the photoresist therefrom, and the organopolysiloxane is made to be soluble in a nonpolar organic solvent, by adopting non-aromatic saturated hydrocarbon groups as organic groups of the organopolysiloxane, respectively, thereby completing the present invention. The present invention will be described hereinafter in detail.

[Non-Aromatic Saturated Hydrocarbon Group-Containing Organopolysiloxane]

Namely, the present invention provides a non-aromatic saturated hydrocarbon group-containing organopolysiloxane containing the following units (I) to (III):

(I) a siloxane unit (T unit) represented by $R^1SiO_{3/2}$: 40 to 99 mol %;

(II) a siloxane unit (D unit) represented by $R^2R^3SiO_{2/2}$: 59 mol % or less; and (III) a siloxane unit (M unit) represented by $R^4R^5R^6SiO_{1/2}$: 1 to 30 mol %;

wherein each $R^1$ to $R^6$ represents a monovalent organic group or a hydrogen atom;

40 mol % or more of all the organic groups and hydrogen atoms represented by the $R^1$ to $R^6$ are each a non-aromatic saturated hydrocarbon group having 3 to 20 carbon atoms;

30 mol % or more of all the organic groups and hydrogen atoms represented by the $R^1$ to $R^3$ may be the same or different and represent non-aromatic saturated hydrocarbon groups, having one of the following cyclic structures having 5 to 7 carbon atoms:

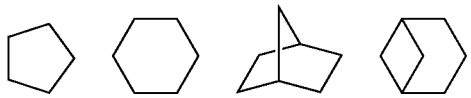

and, those, other than non-aromatic saturated hydrocarbon groups of all the organic groups and hydrogen atoms represented by the $R^1$ to $R^6$, may be the same or different and represent hydrogen atoms or substituted or unsubstituted monovalent hydrocarbon groups, having 1 to 7 carbon atoms.

In the above, the $R^1$ to $R^6$ represents each a monovalent organic group or a hydrogen atom. Further, 40 mol % or more of all the organic groups and hydrogen atoms represented by the $R^1$ to $R^6$ are each a non-aromatic saturated hydrocarbon group having 3 to 20 carbon atoms, and 30 mol % or more of all the organic groups and hydrogen atoms represented by the $R^1$ to $R^3$ may be the same or different and represent non-aromatic saturated hydrocarbon groups, having one of the following cyclic structures having 5 to 7 carbon atoms. Moreover, those, other than non-aromatic saturated hydrocarbon groups of all the organic groups and hydrogen atoms represented by the $R^1$ to $R^6$, may be the same or different and represent hydrogen atoms or substituted or unsubstituted monovalent hydrocarbon groups, having 1 to 7 carbon atoms.

In this way, the organopolysiloxane of the present invention is made to have, as its organic groups, the non-aromatic saturated hydrocarbon groups, respectively, so that the organopolysiloxane is made to be hardly soluble in a polar organic solvent to be exemplarily used upon coating a photoresist onto a semiconductor side of a joined substrate and removing the photoresist therefrom, and in turn to be soluble in a nonpolar organic solvent. Namely, 40 mol % or more of all the organic groups and hydrogen atoms represented by the $R^1$ to $R^6$ of the T, D, and M units are each made to be a non-aromatic saturated hydrocarbon group having 3 to 20 carbon atoms, so that the organopolysiloxane is made to be hardly soluble in the aforementioned polar organic solvent, and in turn to be soluble in a nonpolar hydrocarbon solvent such as hexane, octane, and isododecane.

Specific examples of the non-aromatic saturated hydrocarbon groups include an n-propyl group, isopropyl group, n-butyl group, isobutyl group, t-butyl group, n-pentyl group, cyclopentyl group, n-hexyl group, cyclohexyl group, octyl group, n-decyl group, n-dodecyl group, norbornyl group, norbornylethyl group, and adamantyl group; and the n-propyl group, n-hexyl group, cyclopentyl group, cyclohexyl group, and norbornyl group are more preferable among them. Particularly, the content of the cyclic hydrocarbon groups (non-aromatic saturated hydrocarbon groups containing cyclic structures) is important to possess a higher heat resistance. When the content of the cyclic hydrocarbon groups as the non-aromatic saturated hydrocarbon groups is 30 mol % or more of all the organic groups and hydrogen atoms represented by the $R^1$ to $R^3$, the organopolysiloxane is made to be excellent in heat resistance. Preferable as these cyclic hydrocarbon groups are those structures each including a monovalent and/or divalent cyclopentyl structure, cyclohexyl structure, bicyclo[2.2.1] structure, or bicyclo[3.1.1] structure as shown below:

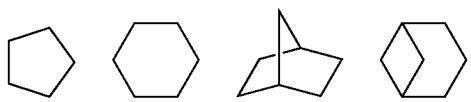

When the content of the non-aromatic saturated hydrocarbon groups each having 3 to 20 carbon atoms is less than 40 mol % of all the organic groups and hydrogen atoms represented by the $R^1$ to $R^6$, the resultant organopolysiloxane is made to be unsuitable because it is then difficult for the same to be hardly soluble in a polar organic solvent to be exemplarily used upon coating a photoresist onto a semiconductor side of a joined substrate and removing the photoresist therefrom. It is noted that, although it is not problematic insofar as concerning the solubility in the solvent when the content of the hydrocarbon groups having cyclic structures, respectively, as the non-aromatic saturated hydrocarbon groups is less than 30 mol % of all the organic groups and hydrogen atoms represented by the $R^1$ to $R^3$, the resultant organopolysiloxane is then made to be occasionally insufficient in durability at high temperatures of 260° C. or higher.

The non-aromatic saturated hydrocarbon group-containing organopolysiloxane of the present invention contains (I) a siloxane unit (T unit) represented by $R^1SiO_{3/2}$ in an amount of 40 to 99 mol %, (II) a siloxane unit (D unit) represented by $R^2R^3SiO_{2/2}$ in an amount of 59 mol % or less, and (III) a siloxane unit (M unit) represented by $R^4R^5R^6SiO_{1/2}$ in an amount of 1 to 30 mol %. The organopolysiloxane having the above structure can be produced by controlling a hydrolytic condensation reaction of a hydrolyzable silane to be used as a starting material. Further, preferable as the non-aromatic saturated hydrocarbon group-containing organopolysiloxane of the present invention, are those, which are in solid form at temperatures not exceeding 40° C., from a standpoint of handling.

Examples of the hydrolyzable silane usable as the starting material include methyl-trichlorosilane, phenyl-trichlorosilane, n-propyl-trichlorosilane, isopropyl-trichlorosilane, n-butyl-trichlorosilane, isobutyl-trichlorosilane, n-pentyl-trichlorosilane, isopentyl-trichlorosilane, cyclopentyl-trichlorosilane, n-hexyl-trichlorosilane, cyclohexyl-trichlorosilane, n-octyl-trichlorosilane, n-decyl-trichlorosilane, n-dodecyl-trichlorosilane, bicyclo[2.2.1]heptyl-trichlorosilane (C1), bicyclo[2.2.1]nonyl-trichlorosilane (C2), bicyclo[3.1.1]decyl-trichlorosilane (C3, C4), dimethyl-dichlorosilane, n-propylmethyl-dichlorosilane, isopropylmethyl-dichlorosilane, n-butylmethyl-dichlorosilane, isobutylmethyl-dichlorosilane, n-hexylmethyl-dichlorosilane, cyclohexylmethyl-dichlorosilane, and diphenyl-dichlorosilane, as well as those hydrolyzable silanes where the above hydrolyzable groups are each a methoxy group or ethoxy group.

Particularly, although the silanes (C1) to (C4) having multiple cyclic structures as shown below are present in endo type and exo type of stereoisomers, such silanes are usable irrespectively of the types.

(C1)

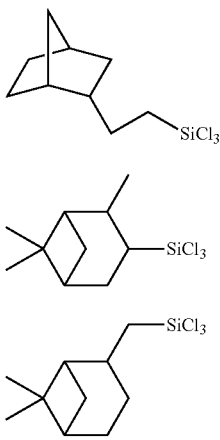

The non-aromatic saturated hydrocarbon group-containing organopolysiloxane of the present invention contains the T units in an amount of 40 to 99 mol %, so that the organopolysiloxane is readily turned into a solid at a temperature of 40° C. or below, which organopolysiloxane is soluble in a nonpolar organic solvent, and which organopolysiloxane is in turn hardly soluble in a polar organic solvent to be exemplarily used upon coating a photoresist onto a semiconductor side of a joined substrate and removing the photoresist therefrom. However, when the T units are less than 40 mol %, the non-aromatic saturated hydrocarbon group-containing organopolysiloxane of the present invention is scarcely turned into a solid at a temperature of 40° C. or below, and it is then difficult for the organopolysiloxane to be soluble in a nonpolar hydrocarbon solvent to be described later. Further, it is preferable that reactive end groups, i.e., silanols, hydrolyzable residues, and the like are not left in the non-aromatic saturated hydrocarbon group-containing organopolysiloxane of the present invention, from a standpoint of thermal stability to be described later. It is therefore preferable for the organopolysiloxane to have a structure including M units introduced at ends thereof, such that the M units are introduced at a content of 1 mol % or more.

The non-aromatic saturated hydrocarbon group-containing organopolysiloxane of the present invention contains the D units in an amount of 59 mol % or less, so that the organopolysiloxane is readily turned into a solid at a temperature of 40° C. or below, which organopolysiloxane is capable of sufficiently joining a wafer and a supporting substrate to each other when the organopolysiloxane is used in a temporary adhesive composition. However, when the D units are more than 59 mol %, the non-aromatic saturated hydrocarbon group-containing organopolysiloxane of the present invention is scarcely turned into a solid at a temperature of 40° C. or below, and the organopolysiloxane is apt to become a viscous substance having a flowability, or a liquid substance. This results in an insufficient joining between a supporting substrate and a wafer having semiconductor circuits in a manner to probably bring about troubles such as a displacement of the laminated wafer during grinding of its back surface or during processing thereafter, so that such a content is undesirable.

The non-aromatic saturated hydrocarbon group-containing organopolysiloxane of the present invention contains the M units in an amount of 1 to 30 mol %, so that the organopolysiloxane is made to be hardly soluble in a polar organic solvent to be exemplarily used upon coating a photoresist onto a semiconductor side of a joined substrate and removing the photoresist therefrom, and the organopolysiloxane is made to have structure where reactive end groups are sufficiently decreased. However, when the M units are less than 1 mol %, the organopolysiloxane is made to be soluble in a polar organic solvent to be exemplarily used upon coating a photoresist onto a semiconductor side of a joined substrate and removing the photoresist therefrom, and it is difficult for the organopolysiloxane to have a structure where reactive end groups such as silanol and hydrolyzable residues are sufficiently decreased. Contents more than 30 mol % are unsuitable, because end groups are then increased in number to thereby relatively decrease a molecular weight of the organopolysiloxane.

In case of presence of molecule end groups which are not end-capped by M units, i.e., presence of hydrolyzable residues such as a silanol group, alkoxysilyl group, and the like, the content of these reactive end groups is preferably to be as less as possible. The end residues such as a silanol group and an alkoxysilyl group are to be preferably included in a molecule in a small amount, because it is then possible to restrict such a situation that cross-linking is caused due to a condensation reaction upon application of heat to considerably change a peelability of a substrate. It is further preferable that the total amount of OH groups of silanol groups, and OR groups of alkoxysilyl groups (Si—OR: where R is an alkoxy residue of an alkoxysilane used as a starting material, or a methoxy group, ethoxy group, n-propoxy group, isopropoxy group, or the like), is 5 wt % or less, preferably 3 wt % or less, of the solid content of all resins. Introduction of the M units enables to decrease such reactive end groups down to a desired amount.

Extremely important is a molecular weight distribution of the non-aromatic saturated hydrocarbon group-containing organopolysiloxane. Namely, it is preferable for the organopolysiloxane to be 2,000 or more as a value of a weight-average molecular weight to be obtained along a calibration curve determined relative to polystyrene standards in GPC (gel permeation chromatography). The non-aromatic saturated hydrocarbon group-containing organopolysiloxane is to preferably have a weight-average molecular weight of 2,000 or more, because the organopolysiloxane is then excellent in heat resistance. The more preferable range of the weight-average molecular weight of the non-aromatic saturated hydrocarbon group-containing organopolysiloxane is about 3,000 to 200,000, more preferably about 5,000 to 150,000.

Usable as a GPC apparatus capable of conducting such an assay and analysis are HLC-8120 GPC, HLC-8220 GPC, and HLC-8230 GPC, manufactured by TOSOH CORPORATION.

[Production Method of Non-Aromatic Saturated Hydrocarbon Group-Containing Organopolysiloxane]

Such a non-aromatic saturated hydrocarbon group-containing organopolysiloxane can be produced by a known method. For example, it is possible, by a hydrolytic condensation reaction, to obtain an organochlorosilane and/or organoalkoxysilane, or a partial hydrolysis condensate thereof, capable of forming the siloxane units (T, D, and M units). For example, the organopolysiloxane can be obtained by mixing a starting silane compound into: a mixed solution of an excessive amount of water for hydrolyzing all hydrolyzable groups (chloro group, alkoxy group, and the like), and an organic solvent capable of dissolving therein the starting silane compound and an organopolysiloxane to be produced. The organopolysiloxane having a desired weight-average molecular weight is obtainable by adjusting temperature and time of the reaction, and blending amounts of the water and organic solvent. The thus produced organopolysiloxane may be used by removing the unnecessary organic solvent component therefrom to thereby once solidify it, upon using the organopolysiloxane as a temporary adhesive, for example.

[Organopolysiloxane Made to have Higher Molecular Weight]

Further, the organopolysiloxane of the present invention embraces an organopolysiloxane made to have a higher molecular weight by adopting the non-aromatic saturated hydrocarbon group-containing organopolysiloxane as a starting material. Such an organopolysiloxane made to have a higher molecular weight will be explained hereinafter.

Examples of the organopolysiloxane made to have a higher molecular weight include such an organopolysiloxane made to have a higher molecular weight, obtained by subjecting an alkenyl group-containing organopolysiloxane (A1) to a hydrosilylation reaction with a hydrosilyl group-containing compound (A2) in the presence of a platinum group metal-based catalyst;

wherein the alkenyl group-containing organopolysiloxane (A1) is, which 2 to 30 mol % of all the organic groups and hydrogen atoms represented by the $R^1$ to $R^6$ are each an alkenyl group having 2 to 7 carbon atoms;

wherein the hydrosilyl group-containing compound (A2) is represented by the following average composition formula (1):

$$R^7{}_a R^8{}_b H_c SiO_{(4-a-b-c)/2} \quad (1),$$

wherein $R^7$ represents a monovalent organic group other than an alkenyl group; $R^8$ represents a divalent organic group; and a, b, and c represent positive numbers satisfying that: $0 \leq a \leq 2.5$, $0 \leq b \leq 1$, $0.75 \leq a+b \leq 2.5$, $0.005 \leq c \leq 1$, and $0.8 \leq a+b+c \leq 4$, wherein the hydrosilyl group-containing compound (A2) contains at least two SiH groups in one molecule, and wherein the hydrosilyl group-containing compound (A2) is such content that the total molar amount of the SiH groups is 0.4 to 1.0 times a total molar amount of the alkenyl groups contained in the alkenyl group-containing organopolysiloxane (A1).

At this time, the content of alkenyl groups is at least 2 mol % to 30 mol % of all the organic groups and hydrogen atoms represented by the $R^1$ to $R^6$. The content of the alkenyl groups is to be preferably 2 mol % or more, because the organopolysiloxane is then increased in molecular weight by the hydrosilylation reaction such that the organopolysiloxane is improved in physical properties such as heat resistance. Further, the content is to be preferably 30 mol % or less, because the organopolysiloxane is then more lowered in solubility in a polar organic solvent to be exemplarily used upon coating a photoresist onto a semiconductor side of a joined substrate and removing the photoresist therefrom.

Examples of such an alkenyl group include a vinyl group, allyl group, butenyl group, hexenyl group, cyclohexenyl group, and norbornenyl group, and the vinyl group is preferable among them from a standpoint of reactivity.

In the average composition formula (1), the $R^7$ represents a monovalent organic group other than an alkenyl group, and the $R^8$ is a divalent organic group. Although the $R^7$ is not particularly limited insofar as the same is a monovalent organic group, examples thereof include a methyl group, n-propyl group, isopropyl group, hexyl group, cyclohexyl group, and phenyl group. Further, the $R^8$ is not particularly limited insofar as the same is a divalent organic group, examples thereof include a methylene group, ethylene group, butanylene group, hexylene group, cyclohexylene group, and phenylene group.

Further, in the average composition formula (1), a and b represent contents of the organic groups in the molecule, respectively, and a, b, and c represent positive numbers satisfying that $0 \leq a \leq 2.5$, $0 \leq b \leq 1$, $0.75 \leq a+b \leq 2.5$, $0.005 \leq c \leq 1$, and $0.8 \leq a+b+c \leq 4$. When a+b is less than 0.75, the value of c, i.e., the content of SiH groups is relatively increased. Considering a hydrosilylation reaction between alkenyl groups of the alkenyl group-containing organopolysiloxane (A1) and SIR groups of the hydrosilyl group-containing compound (A2), an increased amount of SiH groups leads to an excessively higher degree of cross-linkage such that the organopolysiloxane made to have a higher molecular weight tends to be gelated. Further, when the SiH groups are left unreacted in a large amount, the possibility of generating a gas due to thermal degradation is increased. Nonetheless, when a+b is 2.5 or less, the amount of SiH groups is appropriate, so that the reaction is appropriately progressed to make the reaction product to have a higher molecular weight. Moreover, when a is 2 or less, the amount of SiH groups concerning cross-linkage is appropriate to thereby increase the molecular weight up to a targeted value, thereby providing an improved heat resistance. As such, a, b, and c are to be preferably within the above ranges, respectively. Further, the value of c is preferably 1.0 or less in view of the availability of a silicon starting material, and is preferably 0.005 or more so as to sufficiently progress the cross-linking reaction.

Further, the total molar amount of SiH groups of the component (A2) is preferably 0.4 to 1.0 times the total molar amount of the alkenyl groups contained in the component (A1). When the former amount is 0.4 or more times, the molecular weight is sufficiently increased, thereby obtaining a desired heat resistance and adhesiveness. Moreover, the former amount is to be preferably 1.0 or less times, because the resin is then cross-linked to an appropriate degree and is thus rarely gelated, while decreasing SiH groups remaining in the resin, thereby allowing to restrict foaming of the resin upon conducting a heat test after joining.

More specific examples usable as the hydrosilyl group-containing compound (A2) include a straight chain polysiloxane, polysilylalkylene, and polysilylarylene, each having SiH groups at both ends, respectively. Particularly preferable are an organohydrogenpolysiloxane having SiH groups at both ends, as represented by the following structural formula (3), or a bis-silyl compound having SiH groups at both ends, as represented by the following structural formula (4):

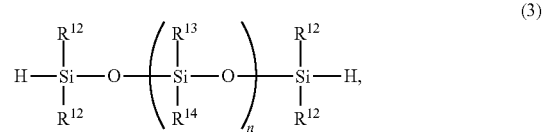

(3)

wherein n represents a positive number of 0 to 400; and $R^{12}$ to $R^{14}$ may be the same or different and represent substituted or unsubstituted monovalent organic groups,

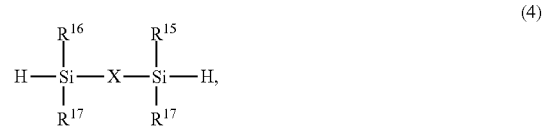

(4)

wherein $R^{15}$ to $R^{17}$ may be the same or different and represent substituted or unsubstituted monovalent organic groups, and X represents a divalent organic group.

The $R^{12}$ to $R^{17}$ may be the same or different and represent substituted or unsubstituted monovalent organic groups. Although the $R^{12}$ to $R^{17}$ are not particularly limited, examples thereof include monovalent hydrocarbon groups each having 1 to 8 carbon atoms, specifically a methyl group, propyl group, hexyl group, cyclohexyl group, and phenyl group. Particularly, the methyl group, cyclohexyl group, and phenyl group are preferable among them.

The polymerization degree n of the organohydrogenpolysiloxane represented by the structural formula (3) is 0 to 400. Those organohydrogenpolysiloxanes each having a polymerization degree n of 200 or more within this range of n, are scarcely progressed in hydrosilylation reaction with alkenyl groups of the (A1), so that such organohydrogenpolysiloxanes are to be preferably used combinedly with siloxanes each having a polymerization degree of 0 to 40. It is noted that n are to be preferably 200 or less, because such organohydrogenpolysiloxanes are each excellent in compatibility with the alkenyl group-containing organopolysiloxane (A1), and are not deteriorated in reactivity of end SiH groups, as well.

The linking group X of the bis-silyl compound represented by the structural formula (4) is a divalent organic group. Although the X is not particularly limited, examples thereof include divalent hydrocarbon groups each having 1 to 10 carbon atoms, and a phenylene group. Particularly, the phenylene group is preferable, from a standpoint of heat resistance of the organopolysiloxane made to have a higher molecular weight.

Such an organopolysiloxane made to have a higher molecular weight is made to be soluble in a nonpolar organic solvent, is in turn made to be hardly soluble in a polar organic solvent to be exemplarily used upon coating a photoresist onto a semiconductor side of a joined substrate and removing the photoresist therefrom, and is further made to be excellent in adhesiveness and heat resistance.

Further, in addition to the addition reaction product of the alkenyl group-containing organopolysiloxane (A1) and the hydrosilyl group-containing compound (A2), the present invention embraces an organopolysiloxane made to have a higher molecular weight by subjecting the combination of the compounds having reactive groups exchanged with each other, i.e., the hydrosilyl group-containing organopolysiloxane (A3) and the alkenyl group-containing compound (A4), to an addition reaction.

Namely, embraced within the scope of the organopolysiloxane of the present invention is an organopolysiloxane obtained by subjecting a hydrosilyl group-containing organopolysiloxane (A3) to a hydrosilylation reaction with an alkenyl group-containing compound (A4) in the presence of a platinum group metal-based catalyst;

wherein the hydrosilyl group-containing organopolysiloxane (A3) is, which 2 to 20 mol % of all the organic groups and hydrogen atoms represented by the $R^1$ to $R^6$ are each a hydrogen atom;

wherein the alkenyl group-containing compound (A4) is represented by the following average composition formula (2):

(2), wherein $R^9$ represents a monovalent organic group other than an alkenyl group; $R^{10}$ represents a divalent organic group; $R^{11}$ represents an alkenyl group having 2 to 6 carbon atoms; d, e, and f represent positive numbers satisfying that: $0 \le d \le 2$, $0 \le e \le 1$, $0.75 \le d+e \le 3$, $0.01 \le f \le 1$, and $0.8 \le d+e+f \le 4$, wherein the alkenyl group-containing compound (A4) contains at least two alkenyl groups in one molecule, and wherein the alkenyl group-containing compound (A4) is such content that the total molar amount of the alkenyl groups is 1.0 to 2.5 times a total molar amount of the SiH groups contained in the hydrosilyl group-containing organopolysiloxane (A3).

At this time, the content of hydrogen atoms is at least 2 mol % to 20 mol % of all the organic groups and hydrogen atoms represented by the $R^1$ to $R^6$. The content of the hydrogen atoms is to be preferably 2 mol % or more, because the organopolysiloxane is then increased in molecular weight by the hydrosilylation reaction such that the organopolysiloxane is improved in physical properties such as heat resistance. Further, the content is to be preferably 20 mol % or less, because the organopolysiloxane is then more lowered in solubility in a polar organic solvent to be exemplarily used upon coating a photoresist onto a semiconductor side of a joined substrate and removing the photoresist therefrom.

In the average composition formula (2), the $R^9$ represents a monovalent organic group other than an alkenyl group, and the $R^{10}$ represents a divalent organic group. The $R^{11}$ represents an alkenyl group having 2 to 6 carbon atoms. Although the $R^9$ is not particularly limited insofar as the same is a monovalent organic group other than an alkenyl group, examples thereof include a methyl group, n-propyl group, isopropyl group, hexyl group, cyclohexyl group, and phenyl group. Further, the $R^{10}$ represents a divalent organic group without particularly limitation, and examples thereof include a methylene group, ethylene group, butanylene group, hexylene group, cyclohexylene group, and phenylene group. Moreover, the $R^{11}$ represents an alkenyl group having 2 to 6 carbon atoms without particularly limitation, and examples thereof include a vinyl group, allyl group, butenyl group, hexenyl group, cyclohexenyl group, and norbornene group, where the vinyl group is preferable among them from a standpoint of reactivity.

Further, in the average composition formula (2), d, e, and f represent contents of the organic groups in the molecule, respectively, and d, e, and f represent positive numbers satisfying that $0 \le d \le 2$, $0 \le e \le 1$, $0.75 \le d+e \le 3$, $0.01 \le f \le 1$, and $0.8 \le d+e+f \le 4$.

Moreover, the total molar amount of alkenyl groups of the component (A4) is preferably 1.0 to 2.5 times the total molar amount of the SiH groups contained in the component (A3). When the former amount is 1.0 or more times, the molecular weight is sufficiently increased, thereby obtaining a desired heat resistance and adhesiveness. Moreover, the former amount is to be preferably 2.5 or less times, because the resin is then cross-linked to an appropriate degree and is thus rarely gelated, while decreasing SiH groups remaining in the resin, thereby allowing to restrict foaming of the resin upon conducting a heat test after joining.

The organopolysiloxane made to have a higher molecular weight in this way, is made to be soluble in a nonpolar organic solvent, is in turn made to be hardly soluble in a polar organic solvent to be exemplarily used upon coating a photoresist onto a semiconductor side of a joined substrate and removing the photoresist therefrom, and is further made to be excellent in adhesiveness and heat resistance.

[Method of Producing Organopolysiloxane Made to have Higher Molecular Weight]

The reaction of the alkenyl group-containing organopolysiloxane (A1) with the hydrosilyl group-containing compound (A2) can be conducted in a manner to dissolve the alkenyl group-containing organopolysiloxane (A1) in an organic solvent, to add a platinum group metal-based catalyst as a hydrosilylation catalyst into the mixture, and to subsequently drop the hydrosilyl group-containing compound (A2) into the mixture while heating it to 50 to 150° C., thereby obtaining an organopolysiloxane made to have a higher molecular weight. The platinum catalyst is a catalyst for promoting a hydrosilylation addition reaction with SiH groups, and examples of this addition reaction catalyst include: platinum-based catalysts such as platinum black, platinic chloride, chloroplatinic acid, a reaction product of chloroplatinic acid with a monohydric alcohol, a complex of chloroplatinic acid with an olefin, and platinum bisacetoacetate; and platinum group metal-based catalysts such as a palladium-based catalyst, and a rhodium-based catalyst. Although the blending amount of the addition reaction catalyst may be a catalytic amount, the catalyst is to be preferably blended as a platinum group metal in an amount of about 1 to 800 ppm, particularly about 2 to 300 ppm, relative to a weight of the component (A1).

Further, the reaction of the hydrosilyl group-containing organopolysiloxane (A3) with the alkenyl group-containing compound (A4) can also be conducted in the same manner as the above by heating and mixing them in the presence of an addition reaction catalyst, thereby obtaining an organopolysiloxane made to have a higher molecular weight.

The molecular weights of the organopolysiloxanes after the hydrosilylation addition reaction will affect properties of temporary adhesives, particularly thermal deformation upon heating, void occurrence at an adhesion interface, and the like.

The polyorganosiloxane made to have a higher molecular weight after the addition reaction is to preferably have a weight-average molecular weight Mw which is greater than 15,000 as a value of a weight-average molecular weight to be obtained along a calibration curve determined relative to polystyrene standards in GPC (gel permeation chromatography). Weight-average molecular weights of 15,000 or more provide organopolysiloxanes excellent in heat resistance. The more preferable range of the weight-average molecular weight is about 20,000 to 200,000, more preferably about 30,000 to 150,000.

[Temporary Adhesive Composition]

The present invention further provides a temporary adhesive composition containing (A) the above described organopolysiloxane, and (B) an organic solvent.

Usable as the organopolysiloxane (A) to be contained in the temporary adhesive composition of the present invention are the above described non-aromatic saturated hydrocarbon group-containing organopolysiloxane, and the organopolysiloxane made to have a higher molecular weight. Further, the component (B) preferably is capable of dissolving therein the organopolysiloxane as the component (A), in a manner to form a thin-film having a thickness of 1 to 200 μm by a known coating film forming method such as spin coating. At this time, the preferable film thickness is 5 to 180 μm, more preferably 30 to 150 μm, and such an organic solvent (B) is preferable which is capable of forming a film thickness in such a range.

In this way, usable as the organic solvent (B) for dissolving the component (A) therein are those other than polar solvents such as ketones, esters, alcohols, and the like, and non-aromatic hydrocarbons are preferable.

Specific examples of the organic solvent (B) contain pentane, hexane, cyclopentane, cyclohexane, methylcyclohexane, octane, isooctane, decane, undecane, isododecane, limonene, and pinene, without particularly limited thereto.

Preferable as the organic solvent (B) for providing a temporary adhesive composition, which can be spin coated and can have a higher safety, are hydrocarbon solvents having boiling points of 120 to 240° C., respectively. Namely, octane, isooctane, decane, isodecane, dodecane, isododecane, and limonene are preferable from this standpoint. The boiling point of 120° C. or higher is preferable in that the hydrocarbon solvent is then also made to have a higher flash point. Further, the boiling point of 240° C. or lower is preferable in that the hydrocarbon solvent is easily volatilized by heating and drying after coating of the composition and rarely remains in the coating. Thus, formation of air bubbles at the joining interface is preferably restricted, even when the temporary adhesive composition is exposed to a high temperature in a heating process after joining of the substrates.

In addition to the above components, it is possible to add a known surfactant into the temporary adhesive composition of the present invention, so as to improve a coating property thereof. Specifically, nonionic surfactants are preferable, and examples thereof include a fluorine-based surfactant, a perfluoroalkyl-polyoxyethylene-ethanol, a fluorinated alkylester, a perfluoroalkyl-amine oxide, and a fluorine-containing organosiloxane-based compound.

Furthermore, it is possible to add a known antioxidant, and a filler such as silica into the temporary adhesive composition of the present invention, so as to further enhance a heat resistance thereof.

[Method of Producing Thinned Wafer]

The present invention further provides a method of producing a thinned wafer by joining a wafer having a circuit-formed surface and a circuit-unformed surface to a supporting substrate, and by grinding the wafer, comprising:

a joining step for forming, on the circuit-formed surface and/or on the supporting substrate, an adhesive layer by the above described temporary adhesive composition, and joining the wafer and the supporting substrate to each other through the adhesive layer therebetween;

a grinding step for grinding the circuit-unformed surface of the wafer joined to the supporting substrate;

a peeling step for peeling the wafer after grinding, from the supporting substrate at the adhesive layer; and a removing step for removing the adhesive layer remaining on the circuit-formed surface of the peeled wafer.

The method of producing a thinned wafer of the present invention is characterized in that the method is configured to adopt the temporary adhesive composition containing the above described organopolysiloxane, as an adhesive layer between a wafer having a semiconductor circuit, and a supporting substrate to be used for thinning the thickness of the wafer. Although the thickness of the thinned wafer to be obtained by the production method of the present invention is not particularly limited, the thickness is typically 300 to 5 μm, more typically 100 to 10 μm.

[Joining Step]

The joining step is a step for forming an adhesive layer by the temporary adhesive composition on the circuit-formed surface and/or supporting substrate, and for joining the wafer and the supporting substrate to each other through the adhesive layer. The wafer having the circuit-formed surface and the circuit-unformed surface is a wafer where one surface is a circuit-formed surface formed with a circuit and the other surface is a circuit-unformed surface. Although the wafer to which the present invention is applicable is not particularly limited, it is typically a semiconductor wafer. Examples of the wafer include not only a silicon wafer, but also a germanium wafer, gallium-arsenide wafer, gallium-phosphorus wafer, and gallium-arsenic-aluminum wafer. The wafer in the joining step is a wafer before the back surface of which is ground in the grinding step, and the thickness thereof is typically 800 to 600 μm, and more typically 775 to 625 μm, without particularly limited thereto.

Usable as the supporting substrate are a silicon wafer, glass wafer, and quartz wafer. In the present invention, it is unnecessary to irradiate a radiant energy beam to the adhesive layer through the supporting substrate, so that the supporting substrate is not required to exhibit a light transmissivity.

The adhesive layer is formed by the above described temporary adhesive composition. The temporary adhesive composition forming the adhesive layer is to preferably contain an organopolysiloxane as a main component. The organopolysiloxane to be contained in the temporary adhesive composition may be used solely in one kind, or mixedly in two or more kinds. The adhesive layer is formed on the circuit-formed surface of the wafer and/or on the supporting substrate. The wafer is joined to the supporting substrate, through the thus formed adhesive layer. When the adhesive layer is to be formed on the wafer, the adhesive layer is formed on the circuit-formed surface of the wafer.

The adhesive layer of the present invention is softened by heating. The temperature range, where the resin in the adhesive layer is softened, is between 80 and 320° C., preferably between 100 and 300° C., and more preferably between 120 and 260° C., such that both substrates (i.e., the wafer and the supporting substrate) are uniformly pressure jointed to each other at this temperature under reduced pressure to thereby form a joined substrate comprising the wafer and the supporting substrate joined to each other. When the interior of a chamber containing both substrates installed therein is heated to the temperature in the above range under reduced pressure, part of the resin in the adhesive layer is softened or melted, and thereafter both substrates are heated and pressure jointed to each other, thereby enabling to form a uniform joining interface therebetween without including any air bubbles in the interface. The temperature of the supporting substrate is to be preferably within the above range, when the wafer and the supporting substrate are joined to each other through the adhesive layer. Since the resin in the adhesive layer is sufficiently softened at this joining temperature, irregularities possibly present on that surface of the wafer, which is to be joined, can be filled without any gaps. The joining can be conducted with a load upon pressure jointing of 20 kN or less, preferably 10 kN or less, more preferably 7 kN or less, for an 8-inch wafer (diameter of 200 mm), for example.

Examples of a wafer joining apparatus include commercially available ones, such as EVG5201S, 850TB manufactured by EVG Company; and XBC300 manufactured by SUSS Company.

[Grinding Step]

The grinding step is a step for grinding a circuit-unformed surface of the wafer joined to the supporting substrate. Namely, this is a step for grinding the back surface side of the wafer of the laminated substrates joined to each other in the joining step, thereby thinning the thickness of the wafer. The manner for grinding the wafer back surface is not particularly limited, and any known grinding manner is adopted such as by a surface grinder. It is preferable to conduct the grinding while cooling the wafer and a grindstone by applying water thereto. Examples of an apparatus for grinding a wafer back surface include DAG-810 (product name) manufactured by DISCO Corporation.

[Processing Step]

It is possible for the method of producing a thinned wafer of the present invention, to include a processing step(s) after the grinding step and before the peeling step. The processing step is a step for applying a processing to the wafer the circuit-unformed surface of which has been ground, i.e., to the circuit-unformed surface of the wafer having been thinned by back surface grinding. This step embraces various processing to be used at the level of wafer, and examples thereof include formation of electrode on the circuit-unformed surface, formation of metal wirings, and formation of a protective film. More specifically, examples thereof include conventionally known steps such as: metal sputtering for forming an electrode or the like; wet etching for etching the sputtered metal layer; pattern forming, by coating of a resist as a mask for forming a metal wiring, followed by exposure and development; peeling of the resist; dry etching; forming a metal plating; silicon etching for forming TSV; and forming an oxide film on a silicon surface.

[Peeling Step]

The peeling step is a step for peeling the wafer after grinding from the supporting substrate at the adhesive layer. Namely, this is a step for peeling the thinned wafer from the supporting substrate, after applying various processing to the wafer and before dicing it. As the peeling technique, various proposals have been made, mainly including a technique for sliding the wafer and supporting substrate in horizontally opposite directions while heating them to thereby separate the substrates from each other, a technique for horizontally fixing one of the laminated substrates and lifting the other substrate with a certain angle from the horizontal direction while heating the fixed substrate, and a technique for applying a protective film onto a ground surface of the ground wafer and peeling the wafer together with the protective film from the supporting substrate in a peeling manner.

Although the present invention is applicable to all the peeling techniques noted above, the horizontally sliding peeling technique is more suitable.

It is possible to peel the wafer from the supporting substrate, by applying a force thereto in a state that the laminated body comprising the wafer, adhesive layer, and supporting substrate is heated such that the adhesive layer is melted or softened. For the adhesive layer to be used in the present invention, the heating temperature is preferably 50 to 300° C., more preferably 60 to 230° C., further preferably 70 to 220° C.

Examples of an apparatus for conducting the peeling techniques include EVG850 DB of EVG Company, and XBC300 of SUSS Company (these are product names, respectively).

[Removing Step]

The removing step is a step for removing the adhesive layer remaining on the circuit-formed surface of the peeled wafer. Removal of the remaining adhesive layer can be conducted by cleaning, for example.

Usable for the removing step is all cleaning solutions each adapted to dissolve the resin in the adhesive layer, particularly the organopolysiloxane of the present invention, and specifically, the above-mentioned organic solvent (B) is usable. These solvents may be used solely in one kind, or mixedly in two or more kinds. Further, when it is difficult to eliminate the adhesive layer remaining on the circuit-formed surface, it is possible to add bases, and/or acids into the solvents. Examples of usable bases include: amines such as ethanolamine, diethanolamine, triethanolamine, triethylamine, and ammonia; and ammonium salts such as tetramethylammonium hydroxide. Usable as the acids are organic acids such as acetic acid, oxalic acid, benzenesulfonic acid, and dodecylbenzenesulfonic acid. These bases and acids can each be added in an amount of 0.01 to 10 wt %, preferably 0.1 to 5 wt %. It is further possible to add an existing surfactant, so as to improve the removability of the adhesive layer remaining on the circuit-formed surface. Usable as the cleaning technique are a technique to clean with a puddle by adopting the cleaning solution, a cleaning technique by spraying, and a technique by immersion in a cleaning solution bath. Suitable temperatures are 10 to 80° C., and preferably 15 to 65° C.

Such a method of producing a thinned wafer enables to peel the wafer from a supporting substrate in a short time in a peeling step, and enables to produce the thinned wafer with a higher efficiency because the wafer is not peeled from the supporting substrate in the production process of the thinned wafer even when a photoresist is coated onto a semiconductor side of a joined substrate and removed therefrom, for example.

EXAMPLES

Although the present invention will be explained hereinafter in more detail by describing Synthesis Examples of the organopolysiloxane of the present invention and Comparative Synthesis Examples, and Examples of the temporary adhesive composition of the present invention and Comparative Examples, the present invention is not limited to them.
[Synthesis of Organopolysiloxane]

Synthesis Example 1

Charged into a 1 L flask having a stirrer, a cooling device, and a thermometer attached thereto, were 234 g (13 mol) of water and 35 g of toluene, and the flask was heated to 80° C. in an oil bath. Further charged into a dropping funnel were 183.6 g (0.8 mol) of norbornyl-trichlorosilane, 12.9 g (0.1 mol) of dimethyl-dichlorosilane, and 10.9 g (0.1 mol) of trimethyl-chlorosilane, the mixture was dropped into the flask with stirring over one hour, and stirring maturation was further conducted at 80° C. for one hour after completion of dropping. Repeated until the toluene phase was brought to be neutral, was a water cleaning operation configured to leave the resultant mixture to stand still while cooling it down to a room temperature in a manner to remove a separated water phase, and to subsequently mixing a water solution of 10% sodium sulfate into the mixture, followed by stirring for 10 minutes and leaving the mixture to stand still for 30 minutes, in a manner to remove a separated water phase; and the reaction was finally stopped. Attached to the flask was an ester adapter, in a manner to heat and reflux the toluene phase containing the organopolysiloxane to thereby remove water from the toluene phase, and this was further continued for one hour after the interior temperature reached 110° C., followed by cooling down to a room temperature. The thus obtained organopolysiloxane solution was filtered to remove insoluble matters therefrom, followed by distillation under reduced pressure to remove toluene, thereby obtaining 134 g of solid organopolysiloxane (Resin 1).

The obtained organopolysiloxane (Resin 1) contained 80 mol % of T units, 10 mol % of D units, and 10 mol % of M units, and ends of the organopolysiloxane (Resin 1) contained 0.1 mol of silanol groups per 100 g of the organopolysiloxane, such that the organopolysiloxane was a transparent and colorless solid in an external appearance and had a weight-average molecular weight of 7,100. The content of norbornyl groups in all the organic groups and hydrogen atoms was 61%. Further, 80% of all the organic groups and hydrogen atoms represented by $R^1$ to $R^3$ were norbornyl groups. This organopolysiloxane (Resin 1) was dissolved in an isododecane solution at a solid content concentration of 55%, and the resultant solution was called a resin solution P.

Synthesis Example 2

Similarly to Synthesis Example 1, charged into the 1 L flask were 234 g (13 mol) of water and 35 g of toluene, and the flask was heated to 80° C. in an oil bath. The same preparation was conducted as Synthesis Example 1 to obtain 124 g of solid organopolysiloxane (Resin 2), except that 103.3 g (0.45 mol) of norbornyl-trichlorosilane, 43.9 g (0.2 mol) of n-hexyl-trichlorosilane, 19.4 g (0.15 mol) of dimethyl-dichlorosilane, 7.1 g (0.05 mol) of methylvinyl-dichlorosilane, and 16.3 g (0.15 mol) of trimethyl-chlorosilane were charged into the dropping funnel.

The obtained organopolysiloxane contained 65 mol % of T units, 20 mol % of D units, and 15 mol % of M units, and ends of the organopolysiloxane contained 0.08 mol of silanol groups and 0.04 mol of vinyl groups per 100 g of the organopolysiloxane. The organopolysiloxane was a transparent and colorless solid in an external appearance and had a weight-average molecular weight of 6,200. The content of norbornyl groups in all the organic groups and hydrogen atoms was 43 mol %, and the content of the vinyl groups was 3.3 mol %. Further, 43% of all the organic groups and hydrogen atoms represented by $R^1$ to $R^3$ were norbornyl groups.

Synthesis Example 3

100 g of the solid organopolysiloxane (Resin 2) obtained in Synthesis Example 2 as the alkenyl group-containing organopolysiloxane (A1), was dissolved in 100 g of toluene, to prepare a solution having a solid content concentration of 50%. Added into this solution was a platinum catalyst in an amount of 20 ppm as platinum atom relative to the resin, and dropped into the solution in a state heated to 60° C. was 32.4 g of a compound (SiH equivalent: 1,473 g/mol) represented by the following formula (5) as the hydrosilyl group-containing compound (A2), whereupon heat generation was observed by a reaction. This amount is equivalent to 0.55 of H/Vi ratio (ratio of SiH groups relative to a total molar amount of alkenyl groups). The reaction was conducted at 100° C. for 2 hours, and then terminated. Thereafter, the resultant solution was concentrated by distillation removal under reduced pressure to distillingly remove toluene from the solution to solidify the reaction product, followed by re-dissolution into isododecane, thereby obtaining a resin solution Q at a solid content concentration of 55%. Further, this resin had a weight-average molecular weight Mw of 47,000 measured by GPC.

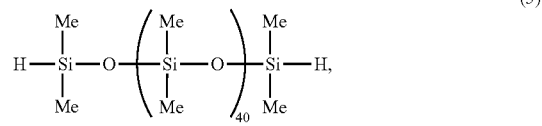

(5)

wherein Me represents a methyl group.

Synthesis Example 4

100 g of the solid organopolysiloxane (Resin 2) obtained in Synthesis Example 2 as the alkenyl group-containing organopolysiloxane (A1), was adopted to conduct the same reaction as Synthesis Example 3, except for adoption of 2.3 g of parabis(dimethylsilyl)benzene (SiH equivalent: 97 g/mol) as the hydrosilyl group-containing compound (A2), thereby obtaining an isododecane solution R containing, at a solid content concentration of 55%, a resin having a weight-average molecular weight of 34,200. This amount of the hydrosilyl group-containing compound (A2) was equivalent to 0.6 as an H/Vi ratio.

Comparative Synthesis Example 1

Similarly to Synthesis Example 1, charged into the 1 L flask were 234 g (13 mol) of water and 35 g of toluene, and the flask was heated to 80° C. in an oil bath. The same preparation was conducted as Synthesis Example 1 to obtain 137 g of solid organopolysiloxane (Resin 3), except that 137.5 g (0.65 mol) of phenyl-trichlorosilane, 50.6 g (0.2 mol) of diphenyl-dichlorosilane, 7.1 g (0.05 mol) of methylvinyl-dichlorosilane, and 10.8 g (0.1 mol) of trimethyl-chlorosilane were charged into the dropping funnel.

The obtained organopolysiloxane (Resin 3) contained 65 mol % of T units, 25 mol % of D units, and 10 mol % of M units, and ends of the organopolysiloxane contained 0.01 mol of silanol groups and 0.034 mol of vinyl groups per 100 g of the organopolysiloxane. The organopolysiloxane was a transparent and colorless solid in an external appearance and had a weight-average molecular weight of 11,700. Further, 72% of all the organic groups and hydrogen atoms represented by $R^1$ to $R^6$ were phenyl groups (aromatic unsaturated hydrocarbon groups).

Comparative Synthesis Example 2

100 g of the organopolysiloxane (Resin 3) obtained in Comparative Synthesis Example 1 as the alkenyl group-containing organopolysiloxane, was adopted to conduct the same reaction as Synthesis Example 3, by adoption of 3.4 g of 1,1,5,5-tetramethyl-3,3-diphenyltrisiloxane (SiH equivalent: 166 g/mol) as the hydrosilyl group-containing compound (A2), followed by condensation, solidification, and subsequent re-dissolution into cyclopentanone to thereby obtain a resin solution S containing, at a solid content concentration of 75%, a resin having a weight-average molecular weight of 44,200. This amount was equivalent to 0.6 as an H/Vi ratio.

Examples 1 to 3, and Comparative Example 1

The organopolysiloxane solutions (P, Q, R, and S) were each used to form an adhesive layer on an 8-inch silicon wafer (diameter: 200 mm, thickness: 725 μm) by spin coating, at a film thickness listed in Table 1. Adopted as a supporting substrate was an 8-inch glass substrate (glass wafer), and this supporting substrate and the silicon wafer having an adhesive layer were joined to each other at an adhering temperature listed in Table 1 in a vacuum joining apparatus, thereby fabricating a laminated body comprising the wafer, adhesive layer, and supporting substrate. Thereafter, the following tests were conducted. Concerning the solvent resistance, evaluation was conducted by separately fabricating a substrate for experiment. The results are listed in Table 1.

[External Appearance]

Each coated film after spin coating was subjected to drying on a hot plate at 150° C. for 2 minutes to thereby completely remove a solvent in the film, followed by confirmation of an external appearance of the coated film by visual inspection and a tack feeling by finger touch. Coated films free of cracks and tacks are each indicated to be excellent (○), and those are each indicated to be defective (x) where a crack and/or tack was recognized.

[Adhesiveness Test]

The joining of 8-inch wafers was conducted by a wafer joining apparatus 520IS manufactured by EVG Company. Each joining was conducted at a temperature listed in Table 1, with a pressure of $10^{-3}$ mbar or lower within a chamber upon joining, and a load of 5 kN. After joining, each interface after cooled down to a room temperature was confirmed for an adhered state by visual inspection, and indicated as "○" where abnormalities such as air bubbles were not caused at the interface, or as "x" where abnormalities were caused.

[Back Surface Grinding Resistance Test]

Grinding of a back surface of each silicon substrate was conducted by using a grinder (DAG810 manufactured by DISCO Corporation). The silicon substrate was ground up to a final substrate thickness of 50 μm, followed by checking of presence or absence of abnormalities such as crack, peeling, and the like by an optical microscope. The situation is indicated as "○" where no abnormalities were caused, or as "x" where abnormalities were caused.

[Heat Resistance Test]

Each laminated body after grinding the back surface of its silicon substrate was placed in an oven in an atmosphere of nitrogen at 250° C. for 2 hours, and then heated on a hot plate at 270° C. for 10 minutes, followed by checking of presence or absence of external appearance abnormality. The situation is indicated as "○" where no external appearance abnormalities were caused, or as "x" where external appearance abnormalities were caused.

[Solvent Resistance Test]

The organopolysiloxane solutions (P, Q, R, and S) were each spin coated onto a 6-inch wafer (diameter: 150 mm) to form a coated film of 30 μm thickness, which was then heated and dried at 150° C. for 2 minutes and thereafter at 200° C. for 2 minutes. Thereafter, each coated film was immersed in propylene glycol monoethyl ether acetate (PGMEA) at 25° C. for 10 minutes, and then checked for presence or absence of dissolution by visual inspection. Films where dissolution of resin was not recognized are each indicated to be excellent (○), and those are each indicated to be defective (x) where dissolution of resin was recognized.

TABLE 1

|  | Example 1 | Example 2 | Example 3 | Comparative Example 4 |
|---|---|---|---|---|
| Resin Solution | Solution P | Solution Q | Solution R | Solution S |
| Film thickness μm | 30 | 30 | 30 | 30 |
| External appearance | ○ | ○ | ○ | ○ |
| Adhering temperature | 200° C. | 200° C. | 200° C. | 170° C. |
| Adhesiveness | ○ | ○ | ○ | ○ |
| Back surface grinding resistance | ○ | ○ | ○ | ○ |
| Heat resistance | ○ | ○ | ○ | ○ |
| Solvent resistance | ○ | ○ | ○ | X |

As listed in Table 1, it is shown that while Comparative Example 1 is insufficient in solvent resistance, Examples 1 to 3 of the temporary adhesive compositions containing the organopolysiloxanes of the present invention each provide a temporary adhesive composition, which is excellent in solvent resistance, and which is also excellent in adhesiveness, back surface grinding resistance, and heat resistance.

It is therefore proven from the above that the organopolysiloxane of the present invention is excellent in adhesiveness and heat resistance, is soluble in a nonpolar organic solvent, and is in turn hardly soluble in a polar organic solvent to be exemplarily used upon coating a photoresist onto a semiconductor side of a joined substrate and removing the photoresist therefrom. It has been further proven that the temporary adhesive composition containing the organopolysiloxane of the present invention provides a temporary adhesive composition which can be peeled from a supporting substrate in a short time and which is excellent in solvent resistance, so that the temporary adhesive composition is not peeled from the supporting substrate upon coating a photoresist onto a semiconductor side of a joined substrate and removing the photoresist therefrom. Further, the method of producing a thinned wafer of the present invention enables to peel the wafer from a supporting substrate in a short time in a peeling step, and enables to produce the thinned wafer with a higher efficiency because the wafer is not peeled from the supporting substrate in the production process of the thinned wafer even when a photoresist is coated onto a semiconductor side of a joined substrate and removed therefrom, for example.

It is noted that the present invention is not limited to the above embodiments. The embodiments are illustrative, and whatever have substantially the same configuration as the technical concept recited in the claims of the present application and exhibit the same functions and effects, are embraced within the technical scope of the present invention.

What is claimed is:

1. An organopolysiloxane obtained by subjecting an alkenyl group-containing organopolysiloxane (A1) to a hydrosilylation reaction with a hydrosilyl group-containing compound (A2) in the presence of a platinum group metal-based catalyst;
   wherein the alkenyl group-containing organopolysiloxane (A1) is a non-aromatic saturated hydrocarbon group-containing organppolysiloxane containing the following units (I) to (III):
   (I) a siloxane unit (T unit) represented by $R^1SiO_{3/2}$: 40 to 99 mol %;
   (II) a siloxane unit (D unit) represented by $R^2R^3SiO_{2/2}$: 59 mol % or less; and
   (III) a siloxane unit (M unit) represented by $R^4R^5R^6SiO_{1/2}$: 1 to 30 mol %;
   wherein:
   $R^1$ to $R^6$ represents a monovalent organic group or a hydrogen atom;
   40 mol % or more of all the organic groups and hydrogen atoms represented by $R^1$ to $R^6$ are each a non-aromatic saturated hydrocarbon group having 3 to 20 carbon atoms;
   30 mol % or more of all the organic groups and hydrogen atoms represented by $R^1$ to $R^3$ may be the same or different and represent non-aromatic saturated hydrocarbon groups, having one of the following cyclic structures having 5 to 7 carbon atoms:

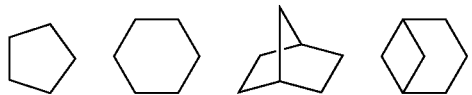

and,
   the remainder of all the organic groups and hydrogen atoms represented by $R^1$ to $R^6$ may be the same or different and represent hydrogen atoms or substituted or unsubstituted monovalent hydrocarbon groups, having 1 to 7 carbon atoms, and
   wherein 2 to 30 mol % of all the organic groups and hydrogen atoms represented by $R^1$ to $R^6$ are each an alkenyl group having 2 to 7 carbon atoms;
   wherein the hydrosilyl group-containing compound (A2) is represented by the following average composition formula (1):

wherein $R^7$ represents a monovalent organic group other than an alkenyl group; $R^8$ represents a divalent organic group; and a, b, and c represent positive numbers satisfying that: $0 \leq a \leq 2.5$, $0 \leq b \leq 1$, $0.75 \leq a+b \leq 2.5$, $0.005 \leq c \leq 1$, and $0.8 \leq a+b+c \leq 4$,
   wherein the hydrosilyl group-containing compound (A2) contains at least two SiH groups in one molecule, and
   wherein the hydrosilyl group-containing compound (A2) is such content that the total molar amount of the SiH groups is 0.4 to 1.0 times a total molar amount of the alkenyl groups contained in the alkenyl group-containing organopolysiloxane (A1).

2. The organopolysiloxane according to claim 1, wherein the hydrosilyl group-containing compound (A2) is an organohydrogenpolysiloxane having SiH groups at both ends, as represented by the following structural formula (3), or a bissilyl compound having SiH groups at both ends, as represented by the following structural formula (4):

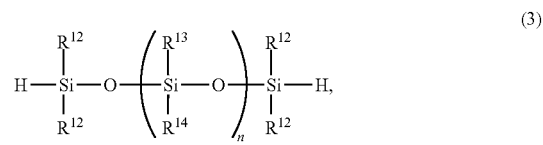

wherein n represents a positive number of 0 to 400; and $R^{12}$ to $R^{14}$ may be the same or different and represent substituted or unsubstituted monovalent organic groups;

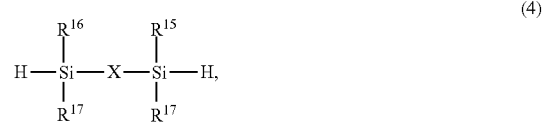

wherein $R^{15}$ to $R^{17}$ may be the same or different and represent substituted or unsubstituted monovalent organic groups; and X represents a divalent organic group.

3. A temporary adhesive composition containing:
   (A) the organopolysiloxane according to claim 2; and
   (B) an organic solvent.

4. The temporary adhesive composition according to claim 3, wherein the organic solvent (B) is a hydrocarbon solvent having a boiling point of 120 to 240° C.

5. A method of producing a thinned wafer by joining a wafer having a circuit-formed surface and a circuit-unformed surface to a supporting substrate, and by grinding the wafer, comprising:
   a joining step for forming, on the circuit-formed surface and/or on the supporting substrate, an adhesive layer by the temporary adhesive composition according to claim 4, and joining the wafer and the supporting substrate to each other through the adhesive layer therebetween;
   a grinding step for grinding the circuit-unformed surface of the wafer joined to the supporting substrate;
   a peeling step for peeling the wafer after grinding, from the supporting substrate at the adhesive layer; and
   a removing step for removing the adhesive layer remaining on the circuit-formed surface of the peeled wafer.

6. A method of producing a thinned wafer by joining a wafer having a circuit-formed surface and a circuit-unformed surface to a supporting substrate, and by grinding the wafer, comprising:
   a joining step for forming, on the circuit-formed surface and/or on the supporting substrate, an adhesive layer by the temporary adhesive composition according to claim 3, and joining the wafer and the supporting substrate to each other through the adhesive layer therebetween;

a grinding step for grinding the circuit-unformed surface of the wafer joined to the supporting substrate;

a peeling step for peeling the wafer after grinding, from the supporting substrate at the adhesive layer; and a removing step for removing the adhesive layer remaining on the circuit-formed surface of the peeled wafer.

7. A temporary adhesive composition containing:
(A) the organopolysiloxane according to claim 1; and
(B) an organic solvent.

8. The temporary adhesive composition according to claim 7, wherein the organic solvent (B) is a hydrocarbon solvent having a boiling point of 120 to 240° C.

9. A method of producing a thinned wafer by joining a wafer having a circuit-formed surface and a circuit-unformed surface to a supporting substrate, and by grinding the wafer, comprising:

a joining step for forming, on the circuit-formed surface and/or on the supporting substrate, an adhesive layer by the temporary adhesive composition according to claim 8, and joining the wafer and the supporting substrate to each other through the adhesive layer therebetween;

a grinding step for grinding the circuit-unformed surface of the wafer joined to the supporting substrate;

a peeling step for peeling the wafer after grinding, from the supporting substrate at the adhesive layer; and a removing step for removing the adhesive layer remaining on the circuit-formed surface of the peeled wafer.

10. A method of producing a thinned wafer by joining a wafer having a circuit-formed surface and a circuit-unformed surface to a supporting substrate, and by grinding the wafer, comprising:

a joining step for forming, on the circuit-formed surface and/or on the supporting substrate, an adhesive layer by the temporary adhesive composition according to claim 7, and joining the wafer and the supporting substrate to each other through the adhesive layer therebetween;

a grinding step for grinding the circuit-unformed surface of the wafer joined to the supporting substrate;

a peeling step for peeling the wafer after grinding, from the supporting substrate at the adhesive layer; and a removing step for removing the adhesive layer remaining on the circuit-formed surface of the peeled wafer.

11. An organopolysiloxane obtained by subjecting a hydrosilyl group-containing organopolysiloxane (A3) to a hydrosilylation reaction with an alkenyl group-containing compound (A4) in the presence of a platinum group metal-based catalyst;

wherein the hydrosilyl group-containing organopolysiloxane (A3) is a non-aromatic saturated hydrocarbon group-containing organopolysiloxane containing the following units (I) to (III):

(I) a siloxane unit (T unit) represented by $R^1 SiO_{3/2}$: 40 to 99 mol %;

(II) a siloxane unit (D unit) represented by $R^2R^3SiO_{2/2}$: 59 mol % or less; and (III) a siloxane unit (M unit) represented by $R^4R^5R^6SiO_{1/2}$: 1 to 30 mol %;

wherein:

$R^1$ to $R^6$ represents a monovalent organic group or a hydrogen atom;

40 mol % or more of all the organic groups and hydrogen atoms represented by $R^1$ to $R^6$ are each a non-aromatic saturated hydrocarbon group having 3 to 20 carbon atoms;

30 mol % or more of all the organic groups and hydrogen atoms represented by $R^1$ to $R^3$ may be the same or different and represent non-aromatic saturated hydrocarbon groups, having one of the following cyclic structures having 5 to 7 carbon atoms:

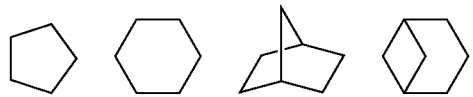

and, the remainder of all the organic groups and hydrogen atoms represented by $R^1$ to $R^6$ may be the same or different and represent hydrogen atoms or substituted or unsubstituted monovalent hydrocarbon groups, having 1 to 7 carbon atoms, and wherein 2 to 20 mol % of all the organic groups and hydrogen atoms represented by $R^1$ to $R^6$ are each a hydrogen atom;

wherein the alkenyl group-containing compound (A4) is represented by the following average composition formula (2):

$$R^9_d R^{10}_e R^{11}_f SiO_{(4-d-e-f)/2} \qquad (2),$$

wherein $R^9$ represents a monovalent organic group other than an alkenyl group; $R^{10}$ represents a divalent organic group; $R^{11}$ represents an alkenyl group having 2 to 6 carbon atoms; d, e, and f represent positive numbers satisfying that: $0<d\leq 2$, $0\leq e\leq 1$, $0.75\leq d+e\leq 3$, $0.01\leq f\leq 1$, and $0.8\leq d+e+f\leq 4$, wherein the alkenyl group-containing compound (A4) contains at least two alkenyl groups in one molecule, and wherein the alkenyl group-containing compound (A4) is such content that the total molar amount of the alkenyl groups is 1.0 to 2.5 times a total molar amount of the SiH groups contained in the hydrosilyl group-containing organopolysiloxane (A3).

12. A temporary adhesive composition containing:
(A) the organopolysiloxane according to claim 11; and
(B) an organic solvent.

13. The temporary adhesive composition according to claim 12, wherein the organic solvent (B) is a hydrocarbon solvent having a boiling point of 120 to 240° C.

14. A method of producing a thinned wafer by joining a wafer having a circuit-formed surface and a circuit-unformed surface to a supporting substrate, and by grinding the wafer, comprising:

a joining step for forming, on the circuit-formed surface and/or on the supporting substrate, an adhesive layer by the temporary adhesive composition according to claim 13, and joining the wafer and the supporting substrate to each other through the adhesive layer therebetween;

a grinding step for grinding the circuit-unformed surface of the wafer joined to the supporting substrate;

a peeling step for peeling the wafer after grinding, from the supporting substrate at the adhesive layer; and a removing step for removing the adhesive layer remaining on the circuit-formed surface of the peeled wafer.

15. A method of producing a thinned wafer by joining a wafer having a circuit-formed surface and a circuit-unformed surface to a supporting substrate, and by grinding the wafer, comprising:

a joining step for forming, on the circuit-formed surface and/or on the supporting substrate, an adhesive layer by the temporary adhesive composition according to claim

12, and joining the wafer and the supporting substrate to each other through the adhesive layer therebetween;

a grinding step for grinding the circuit-unformed surface of the wafer joined to the supporting substrate;

a peeling step for peeling the wafer after grinding, from the supporting substrate at the adhesive layer; and a removing step for removing the adhesive layer remaining on the circuit-formed surface of the peeled wafer.

\* \* \* \* \*